United States Patent
Lin et al.

(10) Patent No.: US 10,787,730 B2
(45) Date of Patent: Sep. 29, 2020

(54) MASK ASSEMBLY WITH SUPPORT BAR CONFIGURED TO SUPPORT BACK PLATE, INSTALLATION THEREOF AND EVAPORATION APPARATUS

(71) Applicants: BOE Technology Group Co., Ltd., Beijing (CN); Ordos Yuansheng Optoelectronics Co., Ltd., Inner Mongolia (CN)

(72) Inventors: Zhiming Lin, Beijing (CN); Zhen Wang, Beijing (CN); Jian Zhang, Beijing (CN); Fuqiang Tang, Beijing (CN); Chunchieh Huang, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 0 days.

(21) Appl. No.: 15/744,952

(22) PCT Filed: May 17, 2017

(86) PCT No.: PCT/CN2017/084733
§ 371 (c)(1),
(2) Date: Jan. 15, 2018

(87) PCT Pub. No.: WO2018/000977
PCT Pub. Date: Jan. 4, 2018

(65) Prior Publication Data
US 2018/0209029 A1    Jul. 26, 2018

(30) Foreign Application Priority Data
Jun. 28, 2016 (CN) .......................... 2016 1 0493408

(51) Int. Cl.
*C23C 14/04* (2006.01)
*C23C 14/24* (2006.01)
(Continued)

(52) U.S. Cl.
CPC .......... *C23C 14/042* (2013.01); *B05C 21/005* (2013.01); *B05D 1/32* (2013.01);
(Continued)

(58) Field of Classification Search
CPC ....... C23C 14/02; C23C 16/02; C23C 14/042; C23C 14/24; B05C 21/005; B05D 1/32
See application file for complete search history.

(56) References Cited

U.S. PATENT DOCUMENTS 3,841,261 A * 10/1974 Hudson ................. B05C 17/06
118/505
8,343,278 B2 * 1/2013 Sung ..................... C23C 14/042
118/504
(Continued)

FOREIGN PATENT DOCUMENTS

CN          102766844 A       11/2012
CN          103695841 A        4/2014
(Continued)

OTHER PUBLICATIONS

International Search Report and English translation of International Search Report for International Application No. PCT/CN2017/084733, dated Aug. 10, 2017, 6 pages.
(Continued)

*Primary Examiner* — Karl Kurple
(74) *Attorney, Agent, or Firm* — Westman, Champlin & Koehler, P.A.

(57) ABSTRACT

The embodiments of the present disclosure provide a mask assembly, an installation method thereof and an evaporation apparatus. The mask assembly includes: a support frame; a
(Continued)

mask fixed on the support frame, the mask including an active mask region and an inactive mask region surrounding the active mask region; and a first support bar fixed on the support frame. The first support bar is disposed on a side of the mask facing away from the support frame, a projection of the first support bar onto a plane where the support frame is located is overlapped with a projection of the mask onto the plane where the support frame is located by a first overlapping portion, and the first overlapping portion is located within a projection area of the inactive mask region onto the plane where the support frame is located.

17 Claims, 13 Drawing Sheets

(51) Int. Cl.
  *B05D 1/32* (2006.01)
  *B05C 21/00* (2006.01)
  *H01L 21/308* (2006.01)
  *H01L 51/00* (2006.01)

(52) U.S. Cl.
  CPC .............. *C23C 14/24* (2013.01); *B05D 1/327* (2013.01); *H01L 21/308* (2013.01); *H01L 21/3083* (2013.01); *H01L 51/0011* (2013.01)

(56) References Cited

U.S. PATENT DOCUMENTS

| | | | | |
|---|---|---|---|---|
| 8,646,406 | B2* | 2/2014 | Ahn | C23C 14/042 118/505 |
| 8,815,015 | B2* | 8/2014 | Kobayashi | C23C 14/042 118/720 |
| 10,150,132 | B2* | 12/2018 | Hamamoto | B05B 5/0255 |
| 10,196,732 | B2* | 2/2019 | Kwon | G03F 7/40 |
| 2002/0067606 | A1* | 6/2002 | Wang | F21V 9/30 362/84 |
| 2003/0156271 | A1* | 8/2003 | Byun | G03F 7/2014 355/75 |
| 2006/0222965 | A1* | 10/2006 | Tsuruko | C23C 14/042 430/5 |
| 2008/0018236 | A1* | 1/2008 | Arai | C23C 14/042 313/504 |
| 2011/0067630 | A1* | 3/2011 | Ko | C23C 14/042 118/721 |
| 2011/0146573 | A1* | 6/2011 | Park | C23C 14/042 118/712 |
| 2014/0041586 | A1* | 2/2014 | Wu | B05C 21/005 118/720 |
| 2015/0101536 | A1* | 4/2015 | Han | C23C 14/042 118/721 |
| 2016/0246010 | A1* | 8/2016 | Medhat | B05B 12/20 |
| 2017/0056911 | A1* | 3/2017 | Kang | H01L 51/0011 |
| 2017/0117474 | A1* | 4/2017 | Kim | C23C 14/042 |

FOREIGN PATENT DOCUMENTS

| | | |
|---|---|---|
| CN | 203960317 U | 11/2014 |
| CN | 105154823 A | 12/2015 |
| CN | 106086782 A | 11/2016 |
| JP | 2007335218 A | 12/2007 |
| KR | 20140064007 A | 5/2014 |

OTHER PUBLICATIONS

Written Opinion and English translation of Box No. 5 of Written Opinion for International Application No. PCT/CN2017/084733, dated Aug. 10, 2017, 7 pages.

* cited by examiner

MASK ASSEMBLY WITH SUPPORT BAR CONFIGURED TO SUPPORT BACK PLATE, INSTALLATION THEREOF AND EVAPORATION APPARATUS

CROSS-REFERENCE TO RELATED APPLICATION

The present application is a Section 371 National Stage application of International Application No. PCT/CN2017/084733, filed on 17 May 2017, which has not yet published, and claims priority to Chinese Patent Application No. 201610493408.6 filed on Jun. 28, 2016, entitled "MASK ASSEMBLY, INSTALLATION METHOD THEREOF AND EVAPORATION APPARATUS" in the State Intellectual Property Office of China, the disclosures of which are incorporated herein by reference in their entirety.

TECHNICAL FIELD

The present disclosure relates to a field of display technology, and in particular, to a mask assembly, an installation method thereof and an evaporation apparatus.

DESCRIPTION OF THE RELATED ART

Organic light emitting diode (OLED) displays have been widely used in many electronic devices, including electronic products such as computer, cell phone and the like, since they have advantages of self luminescence, lightness and thinness, low power consumption, high contrast, high color gamut and flexible display, or the like.

An OLED display device includes a cathode layer, an organic material functional layer, an anode layer, and the like. The organic material functional layer is generally formed by vapor-depositing evaporation materials onto a preset position of a back plate by a mask.

SUMMARY

In an aspect, an embodiment of the present disclosure provides a mask assembly, comprising:

a support frame;

a mask fixed on the support frame, the mask comprising an active mask region and an inactive mask region surrounding the active mask region;

a first support bar fixed on the support frame, wherein the first support bar is disposed on a side of the mask facing away from the support frame, a projection of the first support bar onto a plane where the support frame is located is overlapped with a projection of the mask onto the plane where the support frame is located by a first overlapping portion, and the first overlapping portion is located within a projection area of the inactive mask region onto the plane where the support frame is located.

In one embodiment, the mask assembly further comprises a second support bar fixed on the support frame, wherein the second support bar is disposed on a side of the mask close to the support frame, a projection of the second support bar onto the plane where the support frame is located is overlapped with the projection of the mask onto the plane where the support frame is located by a second overlapping portion, and the second overlapping portion is located within the projection area of the inactive mask region onto the plane where the support frame is located.

In one embodiment, the first support bar and the second support bar extend in a same extending direction and have an overlapping area.

In one embodiment, a central axis of the first support bar coincides with a central axis of the second support bar, and/or the first support bar and the second support bar have a same width.

In one embodiment, the first support bar has a straight shape or a bent shape.

In one embodiment, the second support bar has a straight shape or a bent shape.

In one embodiment, the first support bar, the second support bar and the mask are made of a same material.

In one embodiment, a groove is provided in a side of the mask facing away from the support frame, and at least a portion of the first support bar is located in the groove.

In one embodiment, a surface of the first support bar facing away from the support frame is disposed with respect to a surface of the mask facing away from the support frame by a height difference, and an absolute value of the height difference is less than or equal to 5 μm.

In one embodiment, a surface of the first support bar facing away from the support frame is flush with a surface of the mask facing away from the support frame, or the height difference is reduced by attracting the mask magnetically.

In one embodiment, a depth of the groove accounts for 40%-60% of a thickness of the inactive mask region of the mask.

In one embodiment, the mask assembly comprises at least two masks, and a shielding bar is provided between two adjacent masks on a side close to the support frame and fixed on the support frame.

In one embodiment, in a case that the mask assembly comprises the shielding bar and a second support bar on the support frame, the shielding bar is disposed on a side of the second support bar close to the support frame.

In one embodiment, the support frame is a rectangular frame;

two ends of the mask are respectively fixed on a first set of opposite sides of the support frame and a gap region is formed between the mask and at least one of a second set of opposite sides of the support frame;

the mask assembly further comprises an alignment plate disposed in the gap region and fixed on the first set of opposite sides of the support frame;

two ends of the first support bar are respectively fixed on the second set of opposite sides of the support frame.

In one embodiment, alignment marks are respectively provided on the alignment plate.

In one embodiment, each mask comprises at least one active mask region.

In one embodiment, the active mask region of the mask comprises a plurality of blocking strips spaced apart from each other.

In one embodiment, the mask is a slot type mask, a slit type mask, or any combination thereof.

In one embodiment, the mask is a fine metal mask.

In a second aspect, an embodiment of the present disclosure provides a method for mounting a mask assembly comprising a support frame, a mask, and a first support bar, where the method comprises:

fixing the mask on a first set of opposite sides of the support frame;

on the support frame with the mask fixed thereon, fixing the first support bar on a second set of opposite sides of the support frame, the first support bar being located on a side of the mask facing away from the support frame.

In one embodiment, in a case that the mask assembly further comprises a second support bar, at least two masks and a shielding bar, the method comprises steps of:

fixing the shielding bar on the first set of opposite sides of the support frame;

on the support frame with the shielding bar fixed thereon, fixing the second support bar on the second set of opposite sides of the support frame;

on the support frame with the second support bar fixed thereon, fixing the mask on the first set of opposite sides of the support frame, wherein a gap between two adjacent masks corresponds to a position of the shielding bar and the second support bar is located on an inactive mask region of the mask;

on the support frame with the mask fixed thereon, fixing the first support bar on the second set of opposite sides of the support frame, the first support bar being located in a groove of the mask.

In one embodiment, the method further comprises a step of:

while fixing the mask on the first set of opposite sides of the support frame, fixing an alignment plate on the first set of opposite sides of the support frame at an alignment area between the mask and at least one of the second set of opposite sides of the support frame.

In a third aspect, an embodiment of the present disclosure provides an evaporation apparatus, comprising:

an evaporation source; and the mask assembly as described above, wherein a support frame in the mask assembly is closer to the evaporation source than the mask.

BRIEF DESCRIPTION OF THE DRAWINGS

In order to describe the technical solutions in the embodiments of the present disclosure or in the prior art more clearly, the accompanying drawings required for describing the embodiments or the prior art will be briefly introduced below. Apparently, the accompanying drawings in the following description merely represent a portion of the embodiments of the present disclosure. For those skilled in the art, other drawings may be obtained based on these drawings without any creative work.

FIG. 2b is a cross sectional view taken along a line O-O' in FIG. 2a;

FIG. 3b is a cross sectional view taken along a line P-P' in FIG. 3a;

FIG. 7b is a cross sectional view taken along a line S-S' in FIG. 7a;

FIG. 8b is a cross sectional view taken along a line G-G' in FIG. 8a;

DETAILED DESCRIPTION OF PREFERRED EMBODIMENTS

The technical solutions in the embodiments of the present disclosure will be clearly and completely described with reference to the accompanying drawings in the embodiments of the present disclosure below. Apparently, the described embodiments are merely a portion of the embodiments of the present disclosure, but not all of the embodiments. All other embodiments obtained by those skilled in the art based on the embodiments of the present disclosure without creative efforts shall fall within the scope of the present disclosure.

Figure 1A:
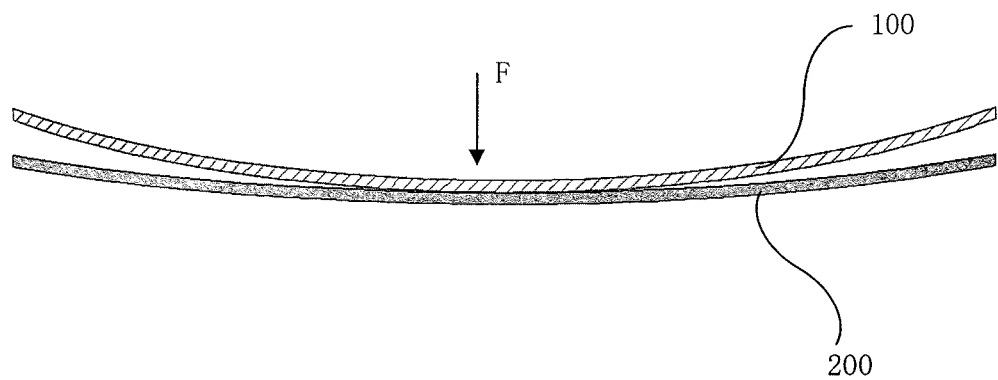
FIG. 1a is a schematic structural view showing an attachment state of a back plate and a mask.
Figure 1B:
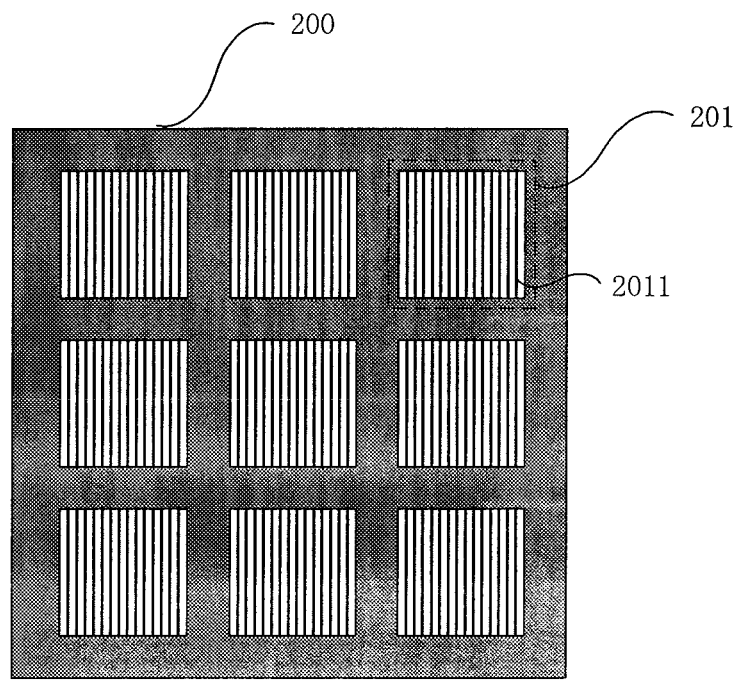
FIG. 1b is a schematic structural view of a mask.

As shown in FIG. 1a, in order to accurately vapor-deposit evaporation materials onto a preset position of a back plate 100 during an evaporation process, it is necessary to attach the back plate 100 to a mask 200 located below. However, when the back plate 100 is attached to the mask 200, the gravity of the back plate 100 itself is larger than that of the mask 200, thereby the back plate 100 has a relatively larger sagging amount in a direction F of the mask 200 (a direction pointing the mask 200) than that of the mask in the same direction. In such a situation, when the back plate 100 and the mask 200 come into contact with each other, they will slide with respect to each other, thereby the mask 200 will be offset, resulting in an offset of a position where the evaporation materials are vapor-deposited on the back plate 100. In addition, as shown in FIG. 1b, an active mask region 201 on the mask 200 includes a plurality of blocking strips 2011 arranged at intervals. When the back plate 100 and the mask 200 slide with respect to each other in contact with each other, a friction occurs between the back plate 100 and the blocking strips 2011. Under the action of the frictional force, the blocking strips 2011 can be easily offset and damaged, resulting in mixed color and other undesirable phenomena.

In summary, since the sagging amount of the back plate 100 is larger than the sagging amount of the mask 200, the mask 200 and the blocking strips 2011 would be offset when the back plate 100 is attached to the mask 200, so that the evaporation materials cannot be effectively vapor-deposited to a predetermined position on the back plate 100, thereby further reducing a yield of product.

Figure 2A:
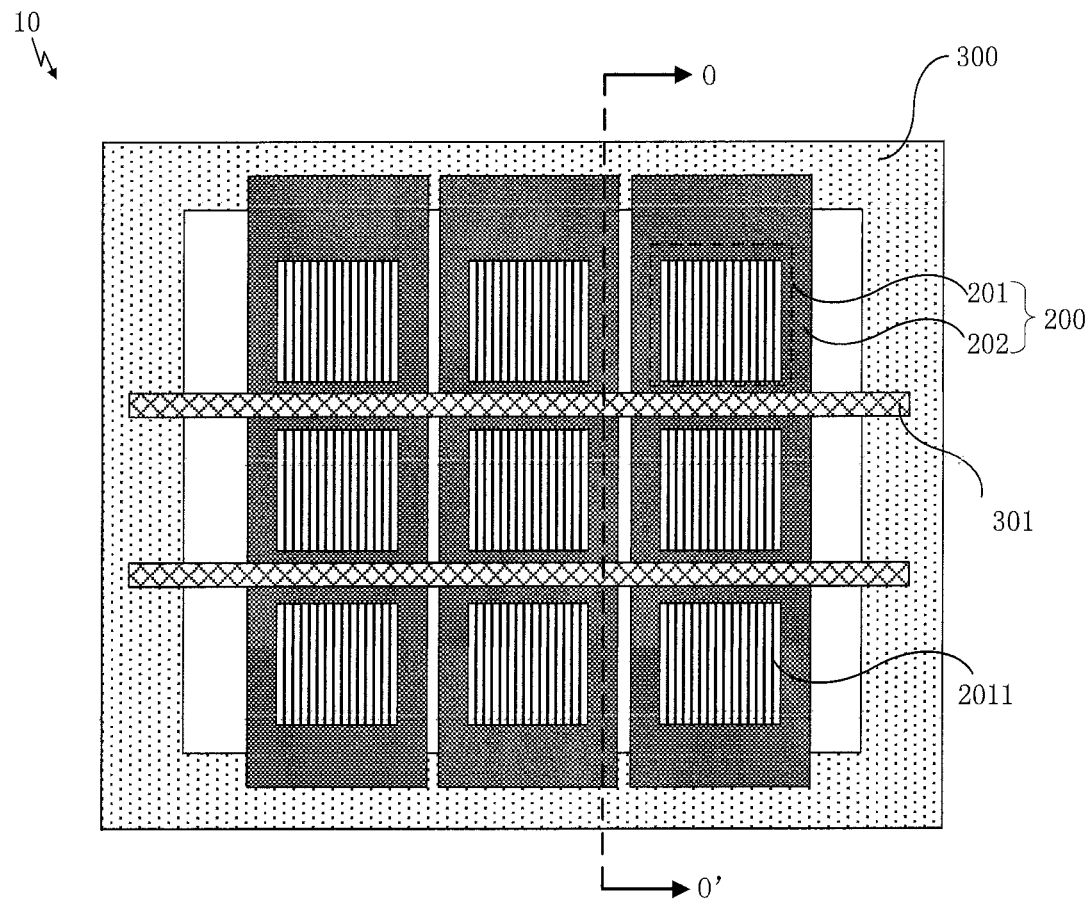
FIG. 2a is a schematic structural view of a mask assembly according to an embodiment of the present disclosure.

In an embodiment of the present disclosure, a mask assembly is provided, as shown in FIG. 2a, the mask assembly 10 includes a support frame 300 and masks 200 fixed on the support frame 300. In FIG. 2a, the mask assembly including three masks is taken as an example to illustrate the present disclosure. The mask 200 includes an active mask region 201 and an inactive mask region 202 surrounding the active mask region 201.

Figure 2B:
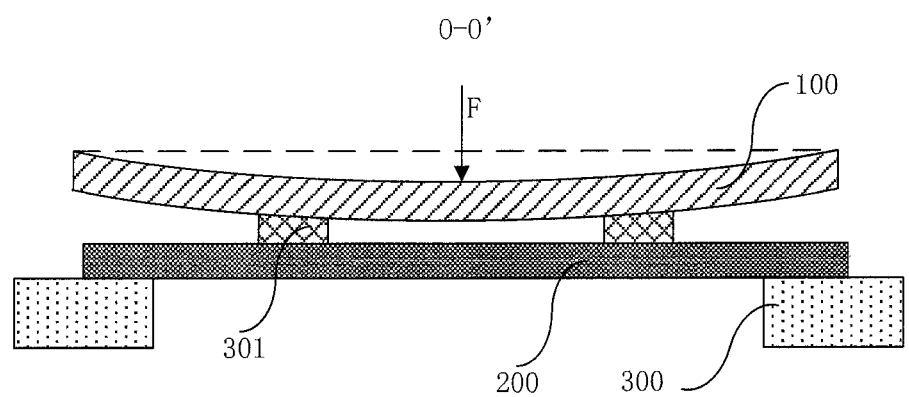
Figure 11:
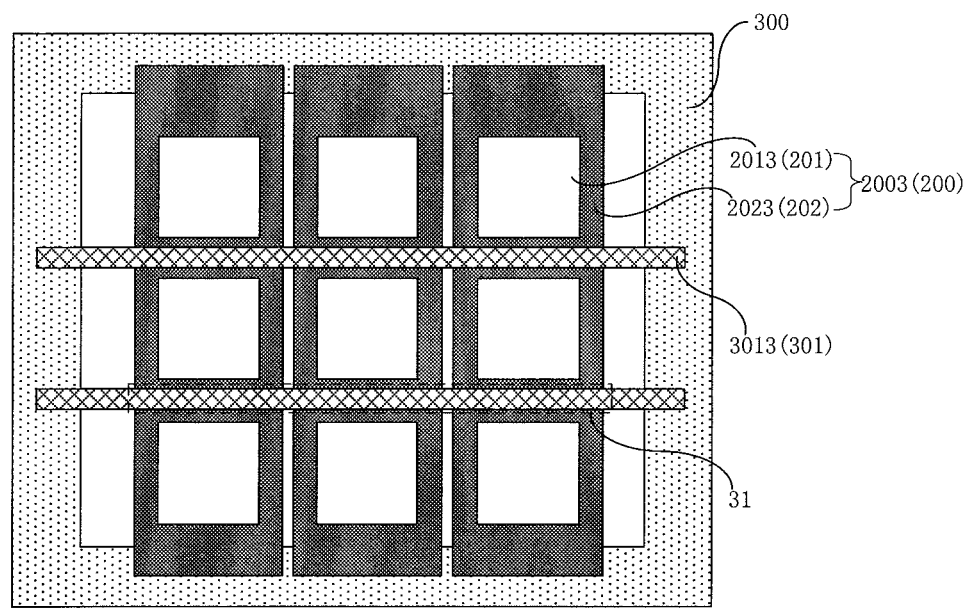
FIG. 11 is a schematic diagram showing projections of the mask and a first support bar on a plane where a support frame is located.

In addition, as shown in FIGS. 2a, 2b and 11, the mask assembly 10 further includes a first support bar 301 fixed on the support frame 300. The first support bar 301 is disposed on a side of the mask 200 facing away from the support frame 300, and a projection 3013 of the first support bar 301 onto a plane where the support frame 300 is located is overlapped with a projection 2003 of the mask 200 onto the plane where the support frame 300 is located by a first overlapping portion 31, and the first overlapping portion 31 is located within a projection area 2023 of the inactive mask region 202 onto the plane where the support frame 300 is located. FIG. 11 shows a projection area 2013 of the active mask region 201 onto the plane where the support frame 300 is located. By means of disposing the first support bar 301 on the inactive mask region 202, it can alleviate the problem of the first support bar 301 affecting the active mask region 201 during the evaporation process.

It should be noted that the active mask region 201 of the mask 200 refers to a region through which the evaporation materials can pass to be vapor deposited on the back plate 100 located above the mask 200. The inactive mask region 202 serves to block the evaporation materials so that the evaporation materials cannot pass through this region to be vapor-deposited on the back plate 100.

In addition, a single mask 200 may be provided with at least one active mask region 201, for example several active mask regions 201, for example nine active mask regions 201 in the form of a 3×3 matrix as shown in FIG. 1b, or for example three active mask regions 201 in a column as shown in FIG. 2a. The present disclosure does not limit the number and arrangement of the active mask regions 201, which can be selected according to the production needs in the actual production process.

Figure 2C:
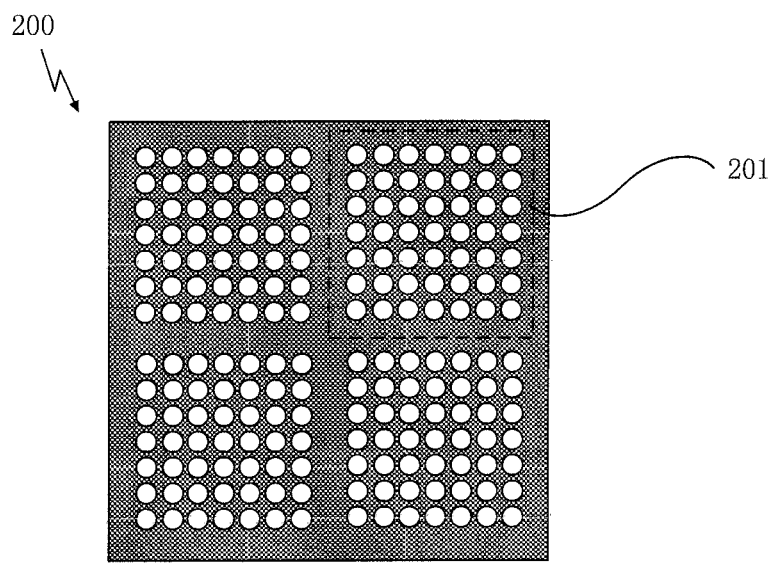
FIG. 2c is a schematic structural view of a mask according to an embodiment of the present disclosure.
Figure 2D:
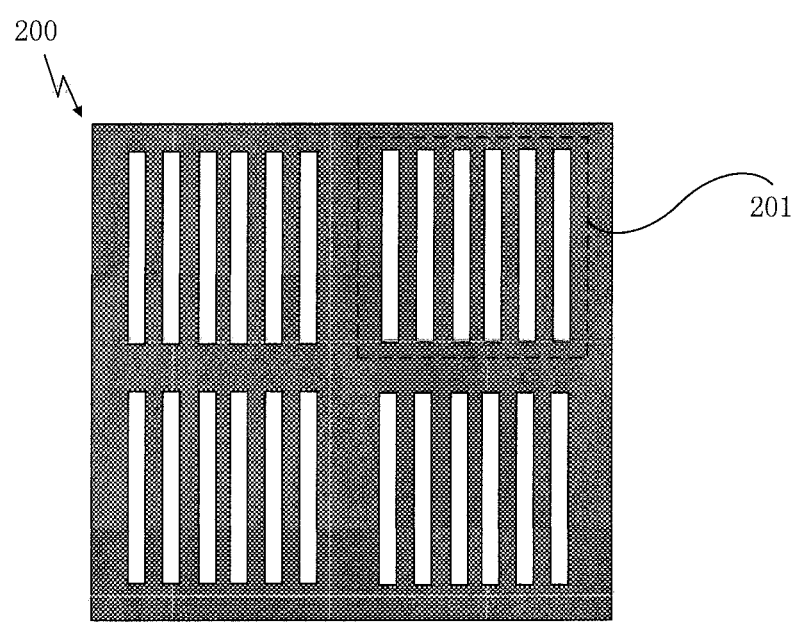
FIG. 2d is a schematic structural view of another mask according to an embodiment of the present disclosure.

Based on this, the mask 200 may also be a slot type mask as shown in FIG. 2c or a slit type mask as shown in FIG. 2d. For example, when manufacturing an OLED display, the slit type mask is usually used (as shown in FIG. 2a, a fine metal mask (FMM)). For the FMM, a width of the blocking strip 2011 in the active mask region 201 is only about several tens of micrometers, and the compressive strength of the blocking strip 2011 is relatively small. However, under the effect of the supporting force of the first support bar 301 to the back plate 100, it can effectively reduce squeezing or pressing effect to the blocking strip 2011 in the active mask region 201 caused by the back plate 100, thereby effectively reducing the offset and damage of the blocking strip 2011 in the FMM.

Figure 2E:
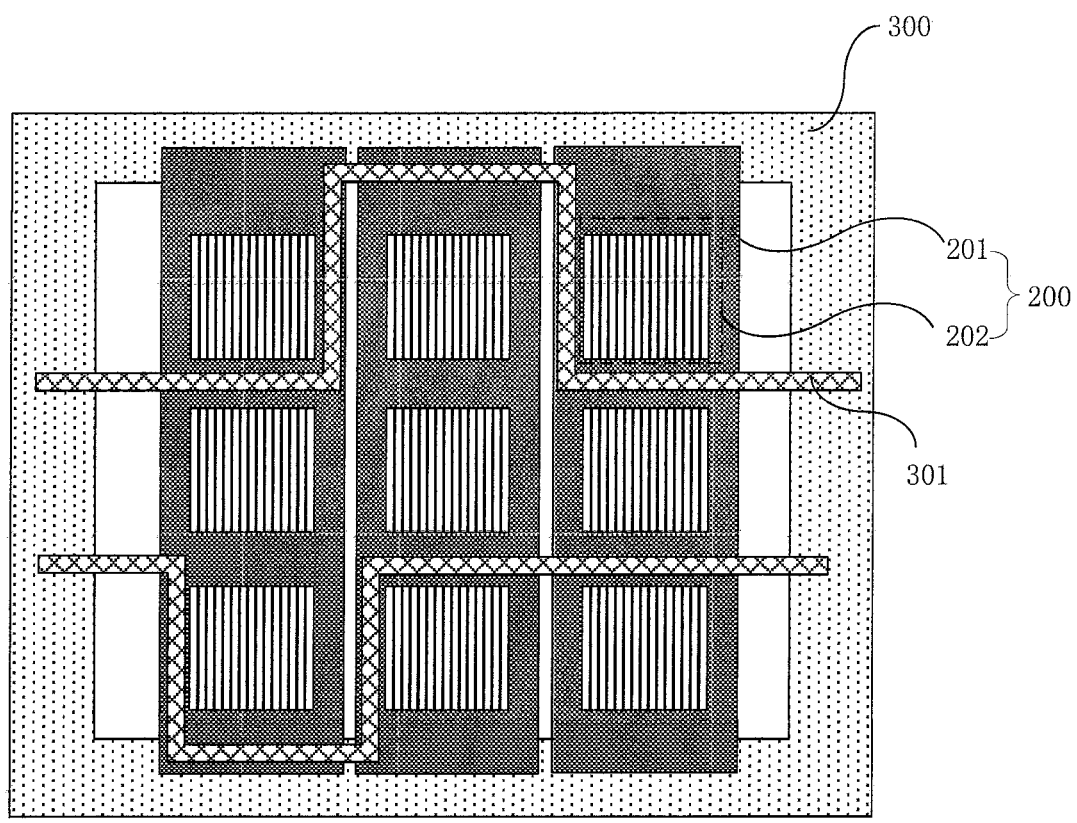
FIG. 2e is a schematic structural view of another mask assembly according to an embodiment of the present disclosure.

It should also be noted herein that the first support bar 301 located above the inactive mask region 202 may have a straight shape as shown in FIG. 2a or a bent shape as shown in FIG. 2e. However, since a middle region of the back plate 100 has the largest sagging amount in a direction F towards the mask 200, the pressing force applied to a region of the mask 200 corresponding to the middle region of the back plate 100 is to be the largest. Therefore, in an example, as shown in FIG. 2a, the first support bar 301 is disposed in a middle region of the mask 200, and the first support bar 301 has a straight shape. In this way, it can minimize the materials for the first support bar 301 with providing sufficient supporting force for the middle region of the back plate 100. In the following embodiments, the first support bar 301 shown in FIG. 2a is taken as an example to further explain the present disclosure.

In the mask assembly according to the embodiments of the present disclosure, the mask assembly includes a support frame and a mask fixed on the support frame, the mask including an active mask region and an inactive mask region surrounding the active mask region. The mask assembly further includes a first support bar fixed on the support frame, the first support bar is disposed on a side of the mask facing away from the support frame and located in the inactive mask region. By means of disposing the first support bar on the inactive mask region, it can avoid the first support bar from affecting the active mask region during the evaporation process.

In the evaporation process, the back plate is usually located above the mask so that the materials evaporated from an evaporation source can be vapor-deposited on the back plate through the mask, and the sagging amount of the back plate in the direction towards the mask is larger than the sagging amount of the mask in the same direction. Under such a situation, the first support bar is provided on the side of the mask adjacent to the back plate, it can provide a certain supporting force to the above-described back plate, so that the sagging amount of the back plate in the direction towards the mask may be reduced, thereby reducing the pressing force between the back plate and the mask. In this way, the friction force between the back plate and the mask due to the pressing force is reduced, thus it is possible to reduce the risk of offset and damage of the mask and the blocking strip in the active mask region, thereby improving the accuracy of evaporation materials vapor-deposited on a predetermined position on the back plate and improving the yield of product.

Figure 3A:
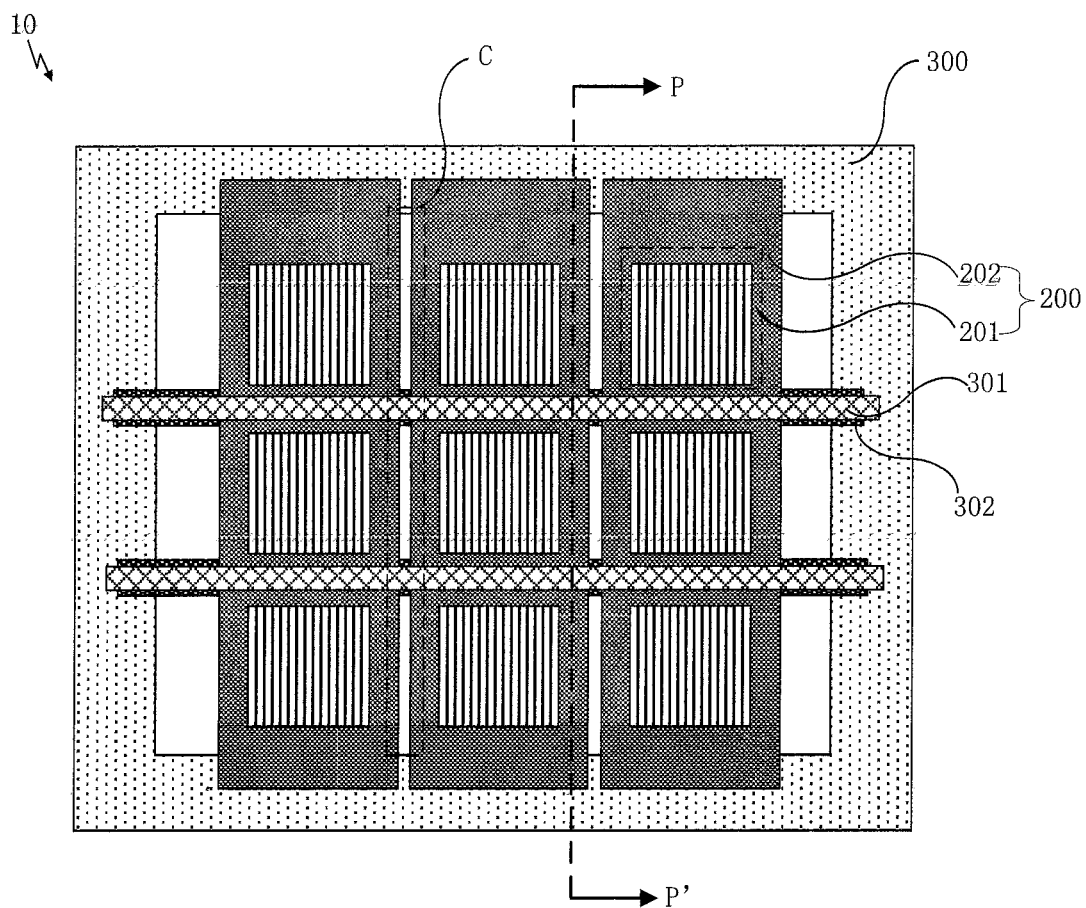
FIG. 3a is a schematic structural view of a mask assembly including a second support bar according to an embodiment of the present disclosure.
Figure 3B:
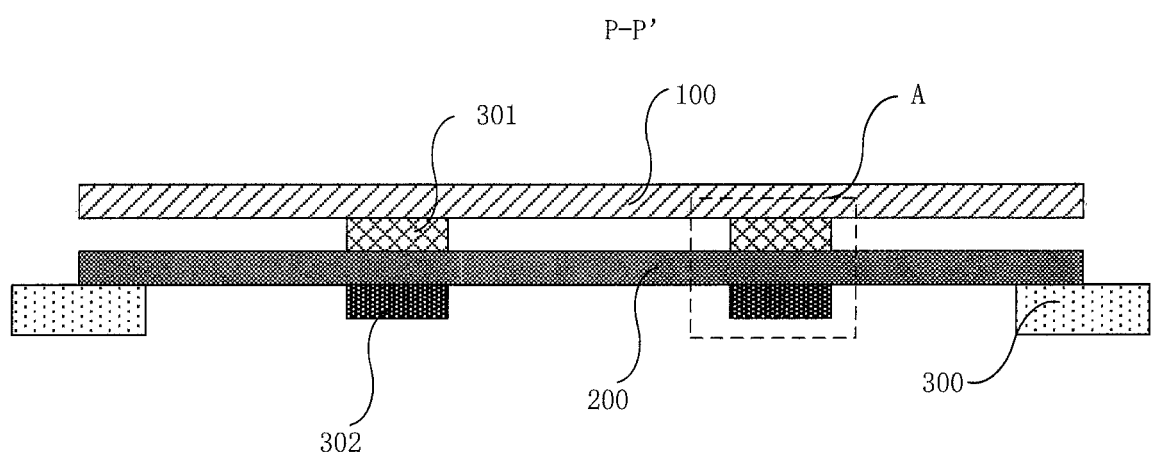
Figure 12:
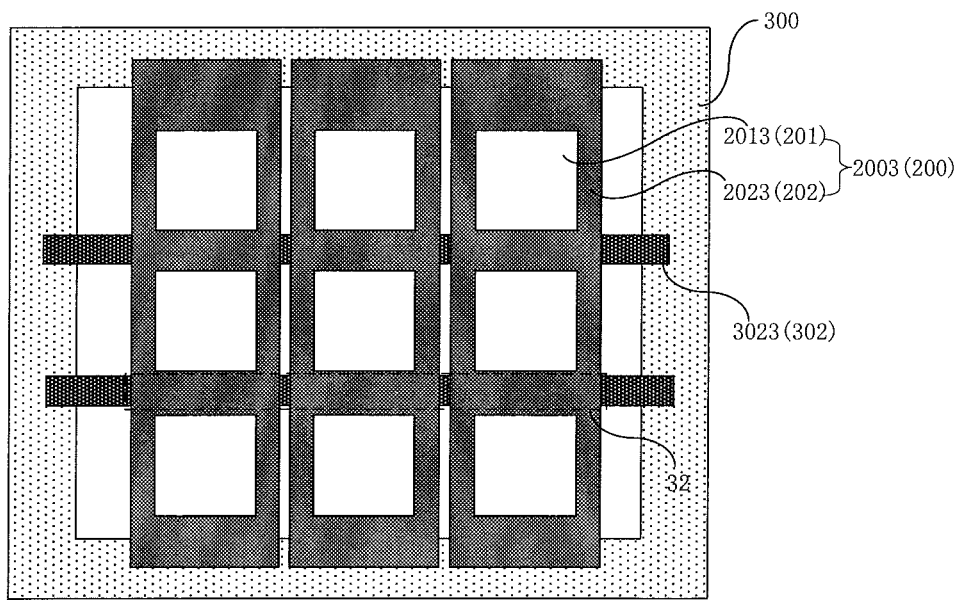
FIG. 12 is a schematic diagram showing projections of the mask and the second support bar on the plane where the support frame is located.

In order to further improve the supporting force for the back plate 100, as shown in FIGS. 3a and 12, the above-described mask assembly 10 further includes a second support bar 302 fixed on the supporting frame 300, and a projection 3023 of the second support bar 302 onto the plane where the support frame 300 is located is overlapped with the projection 2003 of the mask 200 onto the plane where the support frame 300 is located by a second overlapping portion 32, and the second overlapping portion 32 is located within the projection area 2023 of the inactive mask region 202 onto the plane where the support frame 300 is located. FIG. 12 shows a projection area 2013 of the active mask region 201 onto the plane where the support frame 300 is located. As shown in FIGS. 3a and 3b, the second support bar 302 is disposed on a side of the mask 200 close to the support frame 300.

In this way, under the support of the second support bar 302, the sagging amount of the back plate 100 in the direction F towards the mask 200 can be further reduced, thereby reducing the pressing force applied to the mask 200 by the back plate 100, reducing the offset amount of the mask 200 and improving the accuracy of evaporation materials vapor-deposited on the predetermined position on the back plate 100. In addition, the relative positions between the second support bar 302 and the first support bar 301 are not limited in the present disclosure, and they may be crossed or disposed in an overlapping manner. That is, the second support bar 302 may be provided in the same manner as the first support bar 301, for example, may be of a straight shape or a bent shape.

Based on this, in order to maximize the supporting force of the first support bar 301 and the second support bar 302 for the back plate 100, in an example, as shown in FIG. 3a, the first support bar 301 and the second support bar 302 extend in the same direction, and the first support bar 301 and the second support bar 302 have an overlapping area. In this way, as shown in FIG. 3b, the back plate 100 can be simultaneously supported by the first support bar 301 and the second support bar 302 in the overlapping area, and the sagging amount of the back plate 100 in the direction F towards the mask 200 may be greatly reduced, thereby further reducing the offset amount of the mask 200.

The arrangement of the overlapping area of the first support bar 301 and the second support bar 302 will be further explained below.

Figure 4A:
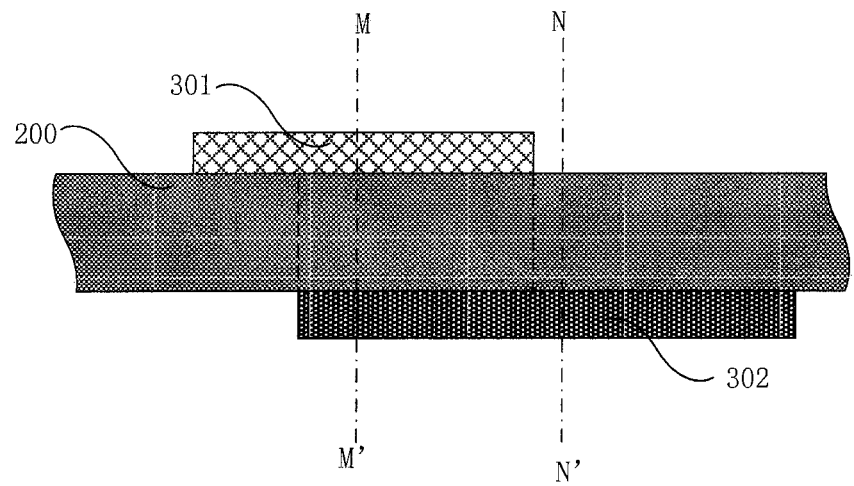
FIG. 4a is a partial enlarged view of an area A in FIG. 3b in an example.

For example, in an example, as shown in FIG. 4a (an enlarged view of an area A in FIG. 3b), a central axis M-M' of the first support bar 301 does not coincide with a central axis N-N' of the second support bar 302, and the first support bar 301 and the second support bar 302 have an overlapping area.

Figure 4B:
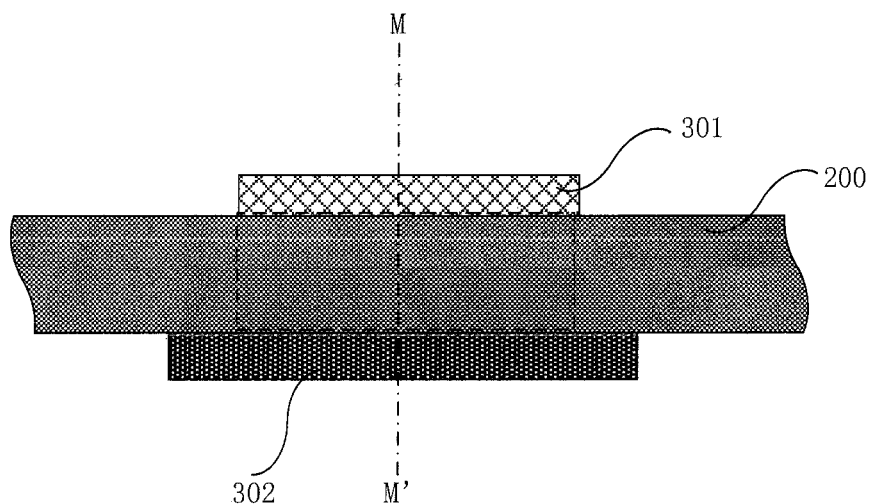
FIG. 4b is a partial enlarged view of an area A in FIG. 3b in another example.

For example again, in another example, as shown in FIG. 4b, the central axes of the first support bar 301 and the second support bar 302 may completely coincide with each other by M-M', and the first support bar 301 and the second support bar 302 have an overlapping area.

When the back plate 100 presses the mask 200, if the central axes of the first support bar 301 and the second support bar 302 do not coincide with each other, the first support bar 301 and the second bar 302 are easily displaced under the pressing force of the back plate 100, thereby affecting the active mask region 201 of the mask 200. Under such a situation, the arrangement as shown in FIG. 4b may be considered, that is, the central axes of the first support bar 301 and the second support bar 302 coincide with each other.

Figure 4C:
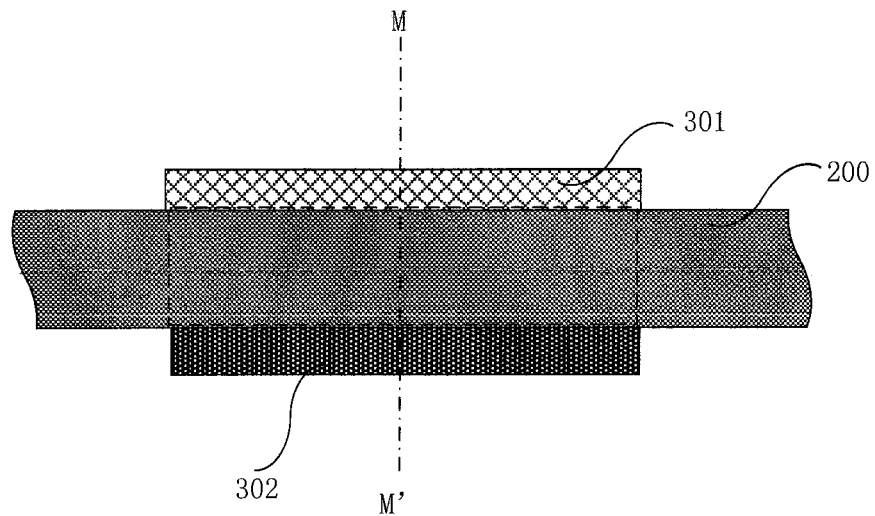
FIG. 4c is a partial enlarged view of an area A in FIG. 3b in a further example.

Further, on the basis of the coincidence of the central axes of the first support bar 301 and the second support bar 302 (as shown in FIG. 4b), on the one hand, it can increase the supporting force of the first support bar 301 and the second support bar 302 for the back plate 100 and reduce the sagging amount of the back plate 100 in the direction towards the mask 200; on the other hand, it can further improve the relative stability of the first support bar 301 and the second support bar 302 when they are pressed and reduce the probability of the displacement of the first support bar 301 and the second support bar 302. In another example, as shown in FIG. 4c, the central axes of the first support bar 301 and the second support bar 302 may completely coincide with each other, and the widths of the first support bar 301 and the second support bar 302 are equal to each other. In this way, the supporting force for the back plate 100 can be increased while the relative stability of the first support bar 301 and the second support bar 302 can be improved when they are pressed.

Based on this, the widths of the first support bar 301 and the second support bar 302 disposed in the inactive mask region 202 can be increased as much as possible without affecting the active mask region 201 in the mask 200, so as to provide the maximum supporting force for the back plate 100 through the first support bar 301 and the second support bar 302 and furthest minimize the sagging amount of the back plate 100 in the direction towards the mask 200.

In addition, it should be noted that, the first support bar 301 and the second support bar 302 are made of for example a metal material with a relatively high rigidity. However, during the evaporation process, the evaporation chamber has a certain evaporation temperature. Since different materials have different thermal expansion coefficients, that is, the amounts of expansion and contraction of different materials in response to the temperature changes are different. Therefore, in one example, the first support bar 301 and the second support bar 302 are made of the same material as the mask 200, for example, a stainless steel material, so as to provide enough supporting force for the back plate 100. In this way, it can avoid that the relative positions of the first support bar 301, the second support bar 302 and the mask 200 change due to the different expansion and contraction amounts of the first support bar 301, the second support bar 302 and the mask 200 according to different thermal expansion coefficients thereof, and further avoid the phenomena that the evaporation materials cannot be accurately vapor-deposited on the predetermined position of the back plate 100.

Figure 5A:
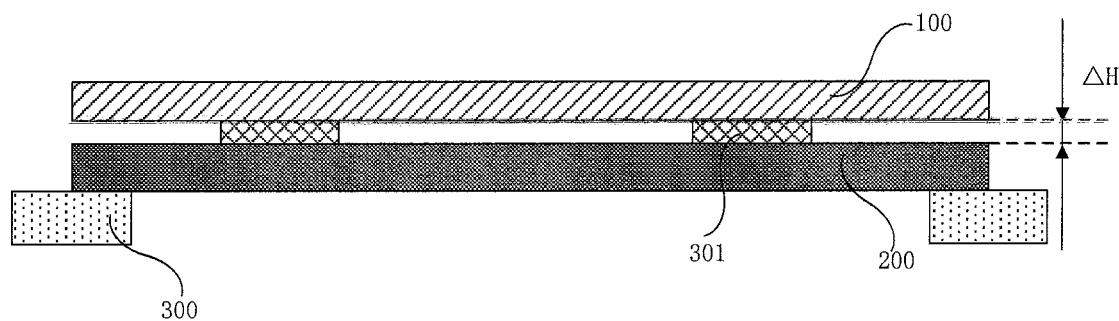
FIG. 5a is a schematic structural view showing an attachment state of a back plate and a mask according to an embodiment of the present disclosure.
Figure 5B:
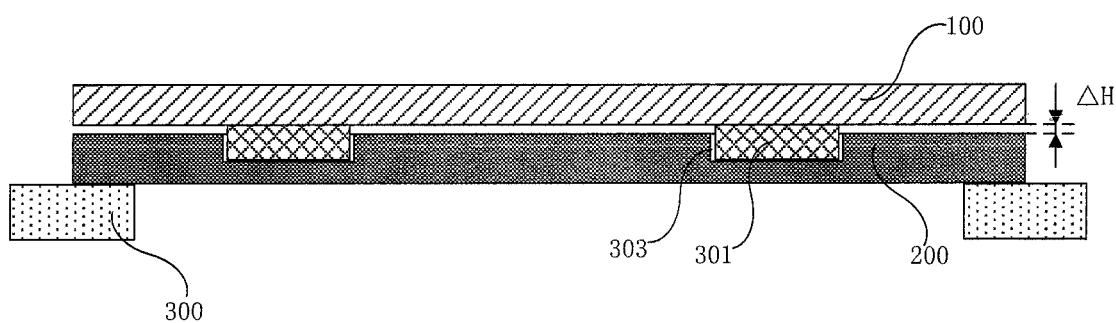
FIG. 5b is a schematic structural view showing another attachment state of a back plate and a mask according to an embodiment of the present disclosure.

Further, since the above-described first support bar 301 is disposed on a side of the mask 200 facing away from the support frame 300, as shown in FIG. 5a, when the back plate 100 is attached to the mask 200 during the sagging process, the height difference ΔH formed between the back plate 100 and the mask 200 is relatively large, the evaporation materials pass through the height difference ΔH with a certain inclination angle in the active mask region 201 of the mask 200 and are vapor-deposited on the inactive mask region 202 of the back plate 100 during the evaporation process, thereby resulting in that there is an evaporation shadow in an evaporation pattern formed on the back plate 100. Therefore, as shown in FIG. 5b, a groove 303 is provided in a side of the mask 200 facing away from the support frame 300, and at least a portion of the first support bar 301 is located in the groove 303. Although FIG. 5b shows that a portion of the first support bar 301 is located in the groove 303, it may also be provided in another example that the first support bar 301 is entirely located in the groove 303. In this way, the height difference ΔH between the back plate 100 and the mask 200 can be reduced while ensuring the effective supporting force of the first support bar 301 for the back plate 100, thereby eliminating the evaporation shadow in the evaporation pattern formed on the back plate 100.

It should be noted herein that the groove 303 in the side of the mask 200 facing away from the support frame 300 may be formed by using a semi-penetration mask process, an exposure process, or an etching process, etc. during manufacturing the mask 200. Specifically, in the process of manufacturing the mask 200, a photoresist is coated on a metal plate used for constituting the mask 200, and then the metal plate is exposed using a semi-penetration mask, wherein the semi-penetration mask includes a light transmitting area, a semi-light transmitting area and an opaque area. Next, the groove 303 is formed in an area of the metal plate corresponding to the semi-light transmitting area by an etching process.

Hereinafter, the specific arrangements of the first support bar 301 in the groove 303 will be described.

Figure 6A:
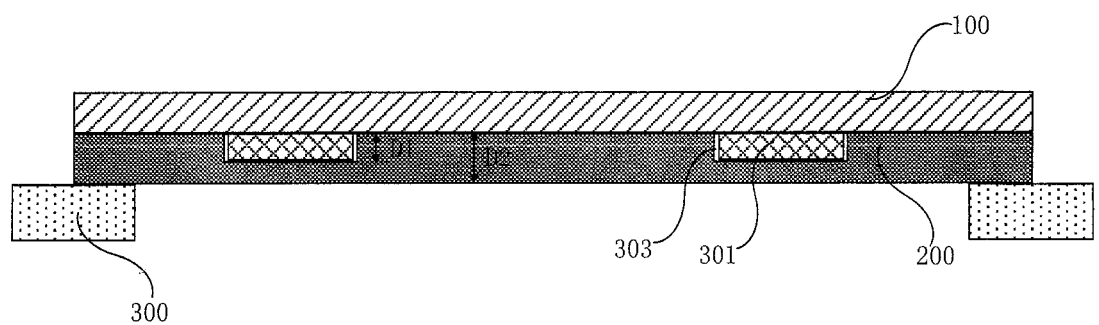
FIG. 6a is a schematic structural view showing a further attachment state of a back plate and a mask according to an embodiment of the present disclosure.

For example, as shown in FIG. 6a, a surface of the first support bar 301 facing away from the support frame 300 is flush with a surface of the mask 200 facing away from the support frame 300.

It should be noted that the arrangement that the surface of the first support bar 301 facing away from the support frame 300 is flush with the surface of the mask 200 facing away from the support frame 300 refers to that the surface of the first support bar 301 facing away from the support frame 300 and the surface of the mask 200 facing away from the support frame 300 are located in the same plane. Apparently, if the height difference between the surface of the first support bar 301 facing away from the support frame 300 and the surface of the mask 200 facing away from the support frame 300 is within a tolerance range, it can be considered as that the surface of the first support bar 301 facing away from the support frame 300 is flush with the surface of the mask 200 facing away from the support frame 300.

Figure 6B:
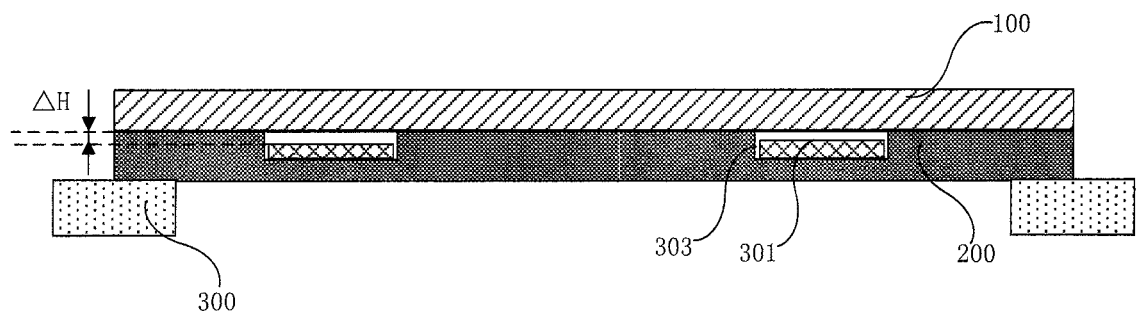
FIG. 6b is a schematic structural view showing a still further attachment state of a back plate and a mask according to an embodiment of the present disclosure.

For example again, as shown in FIG. 6b, the surface of the first support bar 301 facing away from the support frame 300 is slightly lower than the surface of the mask 200 facing away from the support frame 300, i.e., there is a height difference $\Delta H$ between the surface of the first support bar 301 facing away from the support frame 300 and the surface of the mask 200 facing away from the support frame 300. If the height difference $\Delta H$ is greater than 5 $\mu m$, when the back plate 100 sags in the direction F towards the mask 200, the mask 200 may not be in contact with the first support bar 301 due to the limited amount of deformation of the mask under the action of downward pressure. As a result, the first support bar 301 cannot provide the supporting force for the back plate 100. Therefore, in an example, the height difference $\Delta H$ is less than or equal to 5 $\mu m$.

In this case, during the sagging of the back plate 100, the mask 200 would be pressed downwardly to deform. After the mask 200 is deformed downwardly, the back plate 100 and the first support bar 301 are located in the same plane. Thus, the first support bar 301 in the same plane can support the back plate 100 while the back plate 100 continues to sag. In this way, a portion of the pressing force applied to the mask 200 from the back plate 100 is shared by the first support bar 301, thereby the offset of the mask 200 can be reduced.

For another example, as shown in FIG. 5b, the surface of the first support bar 301 facing away from the support frame 300 is slightly higher than the surface of the mask 200 facing away from the support frame 300, so that there is a height difference $\Delta H$ between the back plate 100 and the mask 200. If the height difference $\Delta H$ is greater than 5 $\mu m$, a larger gap exists between the back plate 100 and the mask 200 during the evaporation, thereby there are evaporation shadows in the evaporation pattern formed on the back plate 100. Therefore, in an example, the height difference $\Delta H$ is less than or equal to 5 $\mu m$.

In this case, when the back plate 100 sags in the direction F towards the mask 200, the back plate 100 firstly contacts with the first support bar 301, so that the first support bar 301 can support the back plate 100. And in the case that a small height difference $\Delta H$ exists between the back plate 100 and the mask 200, the mask 200 can be attracted by a magnetic attraction device (a magnetic force generated thereby) to reduce or eliminate the height difference $\Delta H$.

In summary, in order to largest minimize the height difference $\Delta H$ between the back plate 100 and the mask 200 to avoid the evaporation shadow in the evaporation pattern formed on the back plate 100, in an example, as shown in FIG. 6a, the surface of the first support bar 301 facing away from the support frame 300 is flush with the surface of the mask 200 facing away from the support frame 300.

Based on this, as shown in FIG. 6a, a depth D1 of the groove 303 accounts for 40%-60% of a thickness D2 of the inactive mask region 202 of the mask 200. Specifically, if a ratio of the depth D1 of the groove 303 to the thickness D2 of the inactive mask region 202 is less than 40%, then the thickness of the first support bar 301 disposed in the groove 303 is limited, thereby it cannot effectively provide a supporting effect. If the ratio of the depth D1 of the groove 303 to the thickness D2 of the inactive mask region 202 is greater than 60%, the strength of the mask 200 at the position of the groove 303 may be reduced because the depth D1 of the groove 303 is too large, thereby the mask 200 is easily damaged or broken at the position of the groove 303.

In addition, when the mask assembly 10 includes at least two masks 200, for example, the mask assembly 10 shown in FIG. 3a includes three masks 200, and there is a slit region C between two adjacent masks 200, during the evaporation the slit region C corresponds to a cutting line region of the back plate 100 so that the evaporation materials would be vapor-deposited on the cutting line region of the back plate 100 through the slit region C. After the evaporation process is completed, the back plate 100 is cut into different display substrates along the cutting lines. The evaporation materials vapor-deposited on the back plate 100 through the above-described slit region C correspond to an assembly area around the display substrate. Due to the presence of evaporation materials, it would appear poor sealing phenomenon in the subsequent assembly process.

Figure 7A:
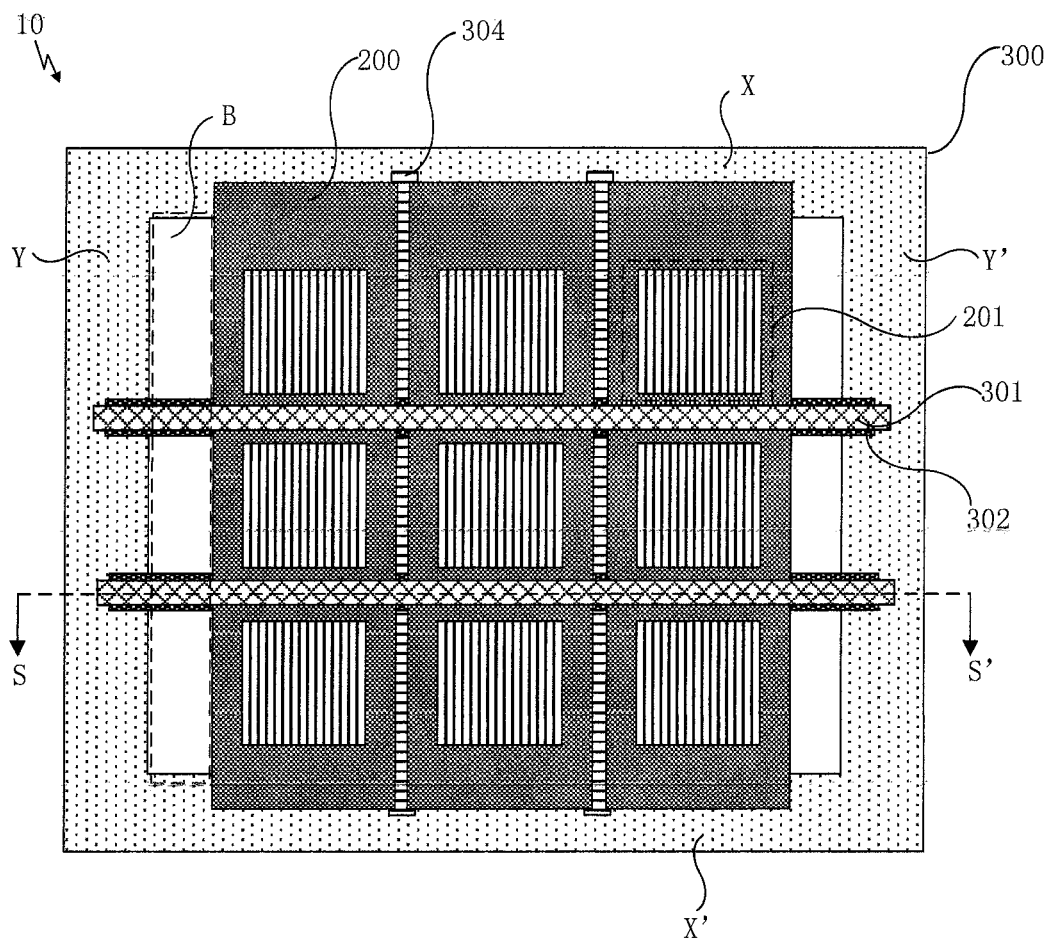
FIG. 7a is a schematic structural view of a mask assembly including a shielding bar according to an embodiment of the present disclosure.

In order to solve the above technical problem, as shown in FIG. 7a, a shielding bar 304 is provided between two adjacent masks 200 on a side close to the support frame 300 and fixed on the support frame 300. In this way, by means of the provision of the shielding bar 304 between two adjacent masks 200, the shielding bar 304 has a certain shielding effect on the evaporation materials, so as to avoid the evaporation materials from being directly vapor-deposited on the cutting line region on the back plate 100 through the slit region C, thereby avoiding the poor sealing phenomenon of the display substrate in the subsequent assembly.

Figure 7B:
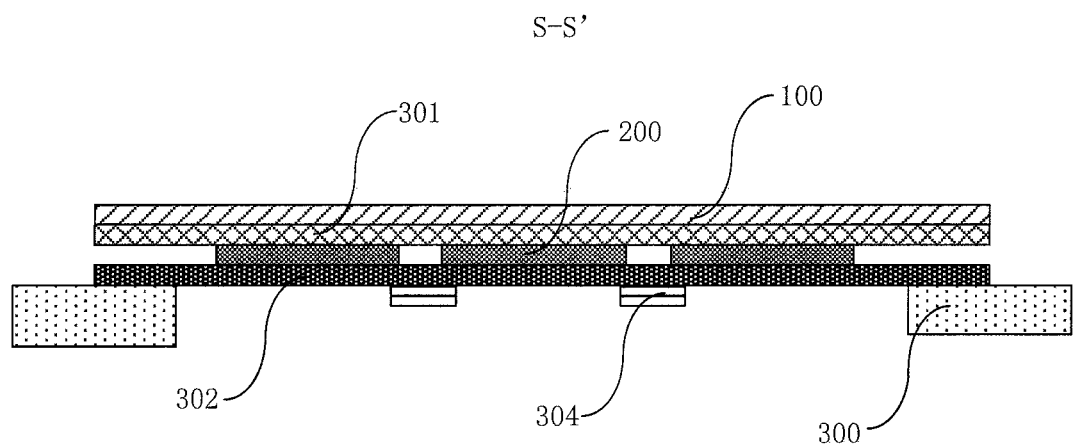

Based on this, as shown in FIG. 7b, in the case that the mask assembly 10 includes the shielding bar 304 and the second support bar 302, the shielding bar 304 is disposed on a side of the second support bar 302 close to the support frame 300. In this way, when the back plate 100 sags, the second support bar 302 is closer to the back plate 100 than the shielding bar 304, thus the second support bar 302 firstly provides a certain supporting force for the back plate 100, thereby reducing the pressing force applied to the shielding bar 304 from the back plate 100, and further reducing the probability of the offset of the shielding bar 304 due to the pressing. As a result, the shielding bar 304 can effectively function as shielding organic materials.

Figure 8A:
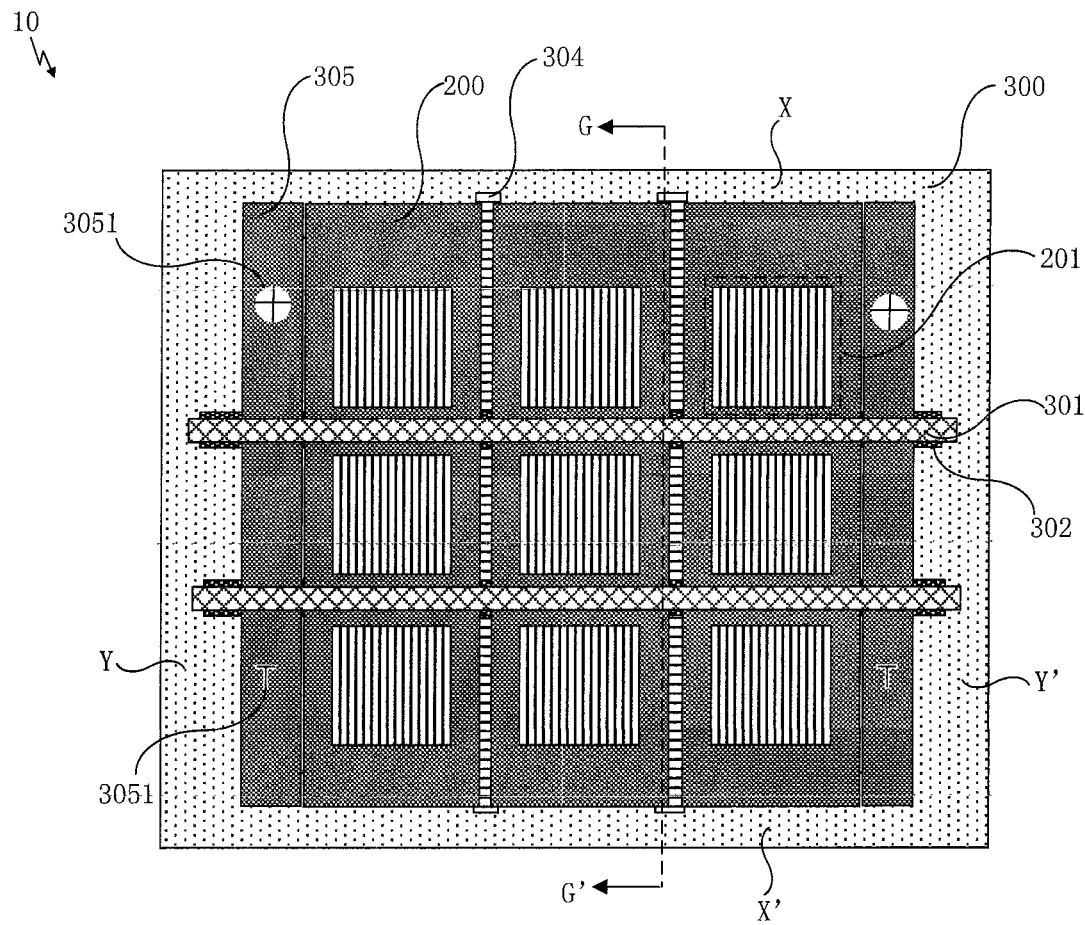
FIG. 8a is a schematic structural view of a mask assembly including an alignment plate according to an embodiment of the present disclosure.

In addition, as shown in FIG. 7a, when the above-described support frame 300 is a rectangular frame, two ends of the mask 200 are respectively fixed on a first set of opposite edges X and X' of the support frame 300, and an alignment area B is formed between the mask 200 and at least one of a second set of opposite sides Y and Y' of the support frame 300. In order to achieve an accurate alignment of the active mask region 201 of the mask 200 and an evaporation active region on the back plate 100, as shown in FIG. 8a, the mask assembly 10 further includes an alignment plate 305 disposed in the above-described alignment area B and fixed on the first set of opposite sides X and X' of the support frame 300. Two ends of the first support bar 301 are respectively fixed on the second set of opposite edges Y and Y' of the support frame 300.

Specifically, alignment marks 3051 are respectively provided on the back plate 100 and the alignment plate 305. As shown in FIG. 8a, the alignment mark 3051 may be a circular-shaped mark, a T-shaped mark, or a cross-shaped mark, which will not be limited in the present disclosure. As for the alignment of the active mask region 201 of the mask 200 and the evaporation active region on the back plate 100, for example, during installing the mask assembly 10, the positions of the mask 200 and the alignment plate 305 in the same coordinate system may be precisely positioned by a manner of coordinate positioning, and then during the evaporation, the circular alignment mark on the alignment plate 305 is made to be aligned with the cross alignment mark on the back plate 100, and/or the T-shaped alignment mark on the alignment plate 305 is made to be aligned with the T-shaped alignment mark on the backing plate 100, so as to accurately determine the positions of the backing plate 100 and the alignment plate 305, thereby achieving that the active mask region 201 of the mask 200 is precisely aligned with the evaporation active region on the back plate 100 by the alignment plate 305.

An embodiment of the present disclosure further provides a method for installing a mask assembly. As shown in FIG. 9, in a case that the mask assembly 10 includes a support frame 300 (the support frame 300 shown in FIG. 8 is rectangular), a first support bar 301, the mask 200, the method for installing the mask assembly 10 includes:

firstly, fixing the mask 200 on a first set of opposite sides X and X' of the support frame 300;

then, on the support frame 300 with the mask 200 fixed thereon, fixing the first support bar 301 on a second set of opposite sides Y and Y' of the support frame 300, the first support bar being located on a side of the mask 200 facing away from the support frame 300.

Based on this, if the mask assembly 10 further includes a second support bar 302, at least two masks 200 and a shielding bar 304, the method for installing the mask assembly 10 includes:

The above installation method will be described in detail with reference to the mask assembly 10 of FIGS. 8a and 8b below.

S101: fixing the shielding bar 304 on the first set of opposite sides X and X' of the support frame 300.

Specifically, the position of the shielding bar 304 corresponds to a slit region C of the two adjacent masks 200 to be fixed subsequently. In this way, by providing the shielding bar 304 between two adjacent masks 200, the shielding bar 304 has a certain shielding effect on the evaporation materials, so as to avoid the evaporation materials from being directly vapor-deposited on the back plate 100 through the slit region C, thereby avoiding poor sealing phenomenon of the display substrate during the subsequent assembly.

S102: on the support frame 300 with the shielding bar 304 fixed thereon, fixing the second support bar 302 on the second set of opposite sides Y and Y' of the support frame 300.

Specifically, under the support of the second support bar 302, the sagging amount of the back plate 100 in the direction F towards the mask 200 can be reduced, thereby reducing the pressing force applied to the mask 200 by the back plate 100, reducing the offset amount of the mask 200 and improving the accuracy of evaporation materials vapor-deposited on the predetermined position on the back plate 100.

It should be noted herein that, in the present disclosure, the shielding bar 304 is firstly fixed on the support frame 300, and then the second support bar 302 is fixed. In this way, the second support bar 302 is closer to the back plate 100 than the shielding bar 304, thus the second support bar 302 firstly provides a certain supporting force for the back plate 100, thereby reducing the pressing force applied to the shielding bar 304 from the back plate 100, and further reducing the probability of the offset of the shielding bar 304 due to the pressing. As a result, the shielding bar 304 can effectively function as shielding the evaporation materials.

S103: on the support frame 300 with the second support bar 302 fixed thereon, fixing the mask 200 on the first set of opposite sides X and X' of the support frame 300, wherein a gap between two adjacent masks 200 corresponds to a position of the shielding bar 304 and the second support bar 302 is located on an inactive mask region 201 of the mask 200.

It should be noted herein that, while the mask 200 is fixed on the first set of opposite sides X and X' of the support frame 300, at an alignment area B between the mask 200 and at least one of the second set of opposite sides Y and Y' of the support frame 300, an alignment plate 305 is further fixed on the first set of opposite sides X and X' of the support frame 300 for accurately positioning the active mask region 201 of the mask 200 and the evaporation active area on the back plate 100 by the alignment plate 305.

S104: on the support frame 300 with the mask 200 fixed thereon, fixing the first support bar 301 on the second set of opposite sides Y and Y' of the support frame 300, the first support bar 301 being located in a groove 303 of the mask 200. Specifically, by disposing the first support bar 301 in the groove 303 of the mask 200, the effective supporting force of the first support bar 301 can be ensured, and the height difference ΔH between the back plate 100 and the mask 200 can be decreased, thereby eliminating the evaporation shadow of the evaporation pattern formed on the back sheet 100.

It should be noted herein that, if the first support bar 301 is fixed on the support frame 300 after the second support bar 302 is fixed on the support frame 300, then the first support bar 301 may loosen when the loosing of the second support bar 302 occurs or other abnormal phenomena occur. Therefore, for example, the first support bar 301 and the second support bar 302 are respectively directly fixed on the support frame 300 to avoid mutual influence therebetween.

Figure 8B:
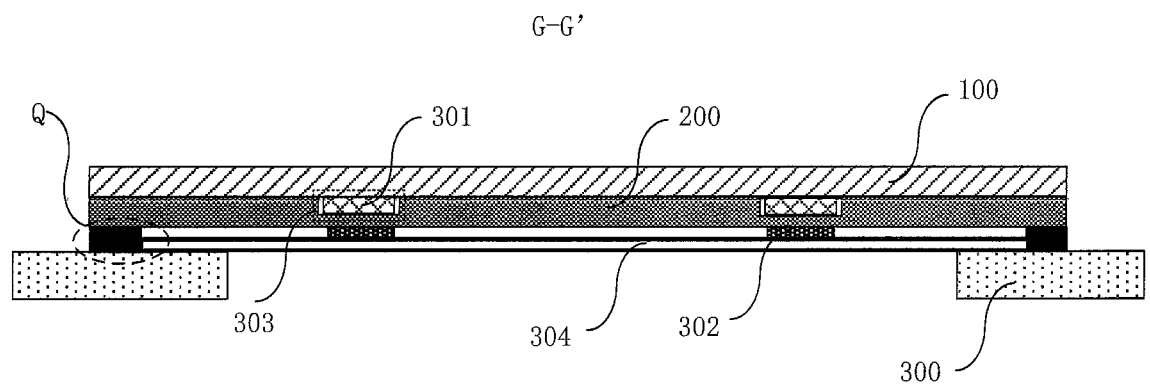
Figure 9:
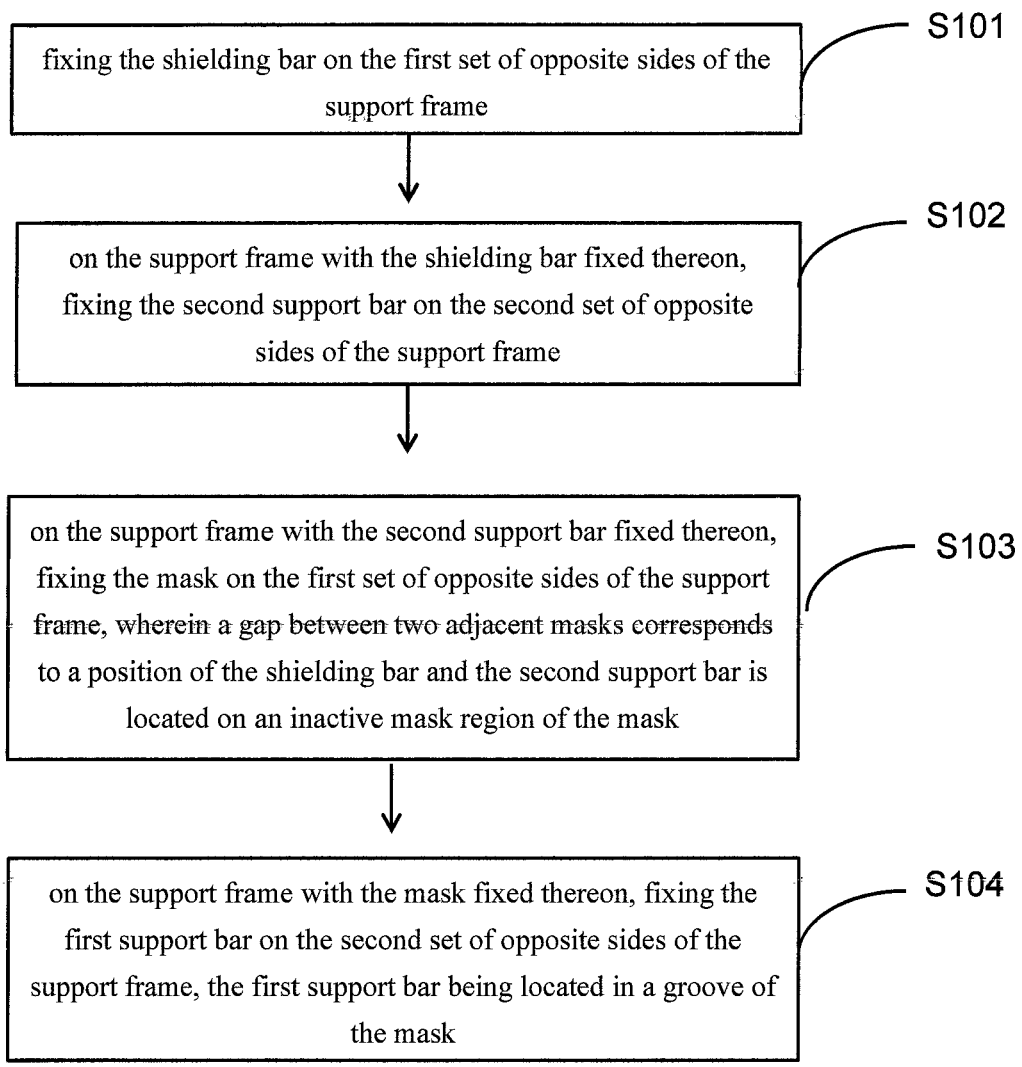
FIG. 9 is a flowchart of a method for installing a mask assembly according to an embodiment of the present disclosure.

In addition, the shielding bar 304, the first support bar 301, the second support bar 302, the mask 200 and the shielding bar 304 may be fixed to the support frame 300 by welding, for example, the region Q shown in FIG. 8b is a soldering point; alternatively, they may also be fixed to the support frame 300 by a bolting connection, which will not be limited in the present disclosure as long as it can ensure that the shielding bar 304, the first support bar 301, the second support bar 302 and the mask 200 can be accurately fixed on the support frame 300.

Figure 10:
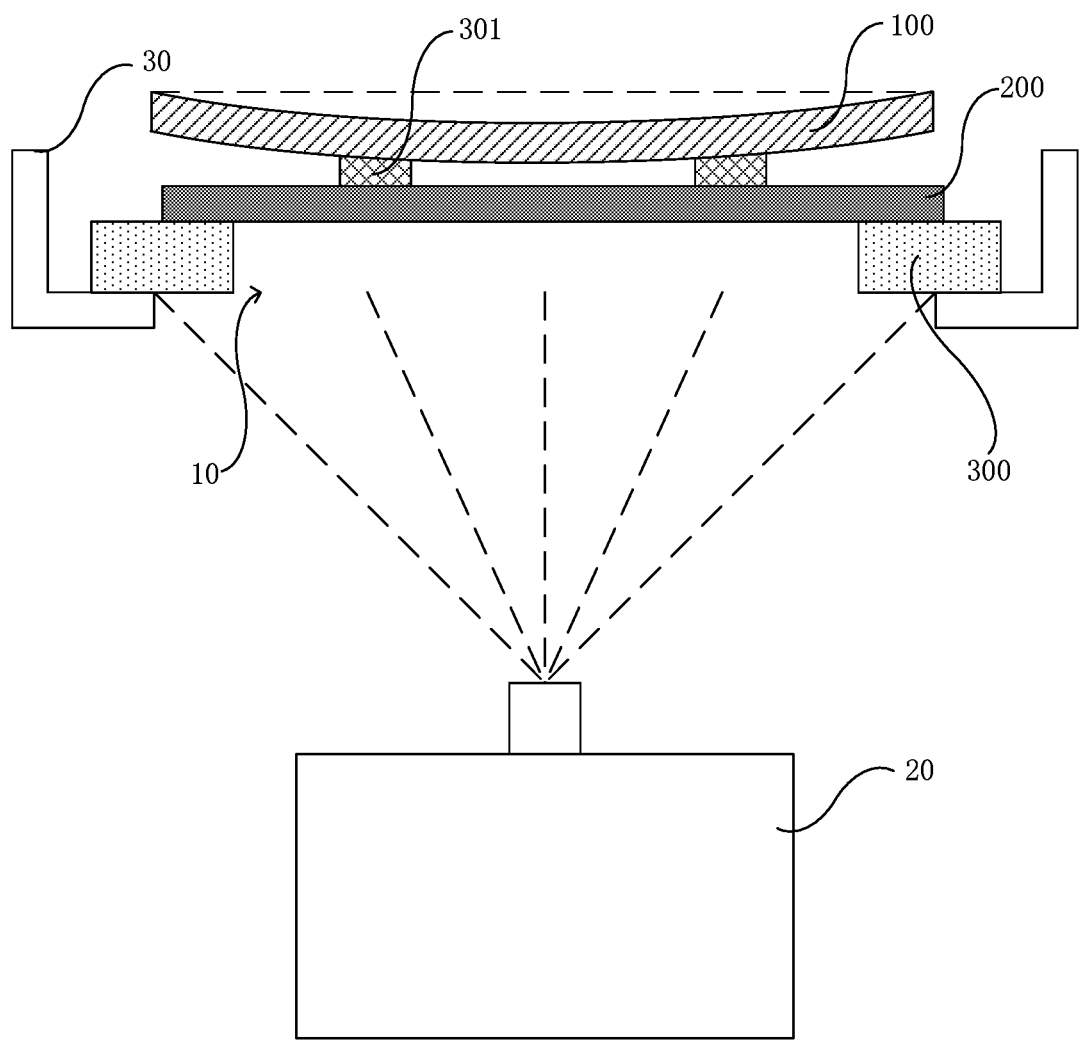
FIG. 10 is a schematic structural view of an evaporation apparatus according to an embodiment of the present disclosure.

An embodiment of the present disclosure further provides an evaporation apparatus, as shown in FIG. 10, the evaporation apparatus includes an evaporation source 20 and a mask assembly 10, wherein the support frame 300 in the mask assembly 10 is disposed closer to the evaporation source 20 than the mask 200. The mask assembly 10 is fixed to a fixing member 30 located above the evaporation source 20 through the support frame 300 in the mask assembly 10.

The evaporation apparatus includes the mask assembly described above, and has the same structure and advantageous effects as those of the mask assembly according to the previous embodiments. Since the structure and advantageous effects of the mask assembly have been described in detail in the previous embodiments, they are not described herein again.

The foregoing descriptions merely represent specific embodiments of the present disclosure, but the scope of the present disclosure is not limited thereto. Any changes or replacements made by those skilled in the art within the technical scope disclosed in the present disclosure should fall within the scope of this disclosure. Therefore, the scope of the present disclosure should be defined by the claims attached herein.

What is claimed is:

1. A mask assembly comprising:
   a support frame;
   a plurality of masks fixed on the support frame, each of the plurality of masks comprising a plurality of active mask regions and an inactive mask region outside the plurality of active mask regions;
   a first support bar fixed on the support frame and configured to support a back plate,
   wherein the first support bar is disposed on a side of the plurality of masks facing away from the support frame, a projection of the first support bar onto a plane where the support frame is located is overlapped with a projection of a first mask of the plurality of masks onto the plane where the support frame is located by a first overlapping portion, the first overlapping portion is located within a projection area of the inactive mask region of the first mask onto the plane where the support frame is located, and a portion of the first overlapping portion is located between projections of two adjacent active mask regions, of the first mask onto the plane, and
   wherein a longitudinal direction of each of the plurality of masks is parallel to a first direction, and the plurality of masks are arranged in a second direction crossing the first direction, and at least a portion of the first support bar extends in the second direction and has a length measured in the second direction that is greater than a size of an active mask region of the first mask measured in the second direction; wherein a groove is provided in the side of the plurality of masks facing away from the support frame, and at least a portion of the first support bar is located in the groove; and wherein a surface of the first support bar facing away from the support frame is disposed with respect to the side of the plurality of masks facing away from the support frame by a height difference, and an absolute value of the height difference is less than or equal to 5 µm.

2. The mask assembly according to claim 1, further comprising a second support bar fixed on the support frame,
   wherein, the second support bar is disposed on a side of the masks facing towards the support frame, a projection of the second support bar onto the plane where the support frame is located is overlapped with a projection of at least a second one of the masks onto the plane where the support frame is located by a second overlapping portion, the second overlapping portion is located within a projection area of the inactive mask region of at least the second mask onto the plane where the support frame is located, and at least a portion of the second support bar extends in the second direction and has a length measured in the second direction that is greater than the size of the active mask region of the mask measured in the second direction.

3. The mask assembly according to claim 2, wherein the first support bar and the second support bar extend in a same extending direction and have an overlapping area.

4. The mask assembly according to claim 3, wherein a central axis of the first support bar coincides with a central axis of the second support bar, and/or the first support bar and the second support bar have a same width.

5. The mask assembly according to claim 2, wherein the first support bar has a straight shape or a bent shape; and/or the second support bar has a straight shape or a bent shape.

6. The mask assembly according to claim 1, wherein a surface of the first support bar facing away from the support frame is flush with the side of the plurality of masks facing away from the support frame, or the height difference is reduced by attracting the plurality of masks magnetically.

7. The mask assembly according to claim 1, wherein a depth of the groove accounts for 40%-60% of a thickness of the inactive mask region of the plurality of masks.

8. The mask assembly according to claim 1, wherein a shielding bar is provided between two adjacent masks on a side of the plurality of masks facing towards the support frame and is fixed on the support frame.

9. The mask assembly according to claim 8, further comprising:
   a second support bar fixed on the support frame,
   wherein, the second support bar is disposed on the side of the plurality of masks facing towards the support frame, a projection of the second support bar onto the plane where the support frame is located is overlapped with a projection of at least a second mask of the plurality of the masks onto the plane where the support frame is located by a second overlapping portion, the second overlapping portion is located within a projection area of the inactive mask region of at least the second mask onto the plane where the support frame is located, and at least a portion of the second support bar extends in the second direction and has a length measured in the second direction that is greater than the size of the active mask region of the second mask measured in the second direction, and
   wherein the shielding bar is disposed on a side of the second support bar facing towards the support frame.

10. The mask assembly according to claim 1, wherein the support frame is a rectangular frame;
    two ends of each of the plurality of masks are respectively fixed on a first set of opposite sides of the support frame and a gap region is formed between at least one outermost mask and a corresponding one of a second set of opposite sides of the support frame;
    the mask assembly further comprises an alignment plate disposed in the gap region and fixed on the first set of opposite sides of the support frame;
    two ends of the first support bar are respectively fixed on the second set of opposite sides of the support frame.

11. The mask assembly according to claim 10, wherein alignment marks are respectively provided on the alignment plate.

12. The mask assembly according to claim 1, wherein the active mask region of the first mask comprises a plurality of blocking strips spaced apart from each other.

13. The mask assembly according to claim 1, wherein the first mask is a fine metal mask.

14. A method of mounting a mask assembly, said mask assembly, comprising:
   a support frame;
   a plurality of masks fixed on the support frame, each of the plurality of masks comprising a plurality of active mask regions and an inactive mask region outside the plurality of active mask regions;
   a first support bar fixed on the support frame and configured to support a back plate,
   wherein the first support bar is disposed on a side of the plurality of masks facing away from the support frame, a projection of the first support bar onto a plane where the support frame is located is overlapped with a projection of a first mask of the plurality of masks onto the plane where the support frame is located by a first overlapping portion, the first overlapping portion is located within a projection area of the inactive mask region of the first mask onto the plane where the support frame is located, and a portion of the first overlapping portion is located between projections of two adjacent active mask regions, of the first mask onto the plane, and
   wherein a longitudinal direction of each of the plurality of masks is parallel to a first direction, and the plurality of masks are arranged in a second direction crossing the first direction, and at least a portion of the first support bar extends in the second direction and has a length measured in the second direction that is greater than a size of an active mask region of the first mask measured in the second direction; wherein a groove is provided in the side of the plurality of masks facing away from the support frame, and at least a portion of the first support bar is located in the groove; and wherein a surface of the first support bar facing away from the support frame is disposed with respect to the side of the plurality of masks facing away from the support frame by a height difference, and an absolute value of the height difference is less than or equal to 5 µm; the method comprising:
   fixing the plurality of masks on a first set of opposite sides of the support frame; on the support frame with the plurality of masks fixed thereon,
   fixing the first support bar on a second set of opposite sides of the support frame, the first support bar being located on the side of the plurality of masks facing away from the support frame.

15. The method according to claim 14, wherein, in a case that the mask assembly further comprises a second support bar, and a shielding bar, the method comprises steps of:
   fixing the shielding bar on the first set of opposite sides of the support frame;
   on the support frame with the shielding bar fixed thereon, fixing the second support bar on the second set of opposite sides of the support frame;
   on the support frame with the second support bar fixed thereon, fixing the plurality of masks on the first set of opposite sides of the support frame, wherein a gap between two adjacent masks corresponds to a position of the shielding bar and the second support bar is located on the inactive mask regions of the plurality of masks;
   on the support frame with the plurality of masks fixed thereon, fixing the first support bar on the second set of opposite sides of the support frame, the first support bar being located in grooves of the plurality of masks.

16. The method according to claim 15, further comprising a step of:
   while fixing the plurality of masks on the first set of opposite sides of the support frame, fixing an alignment plate on the first set of opposite sides of the support frame at an alignment area between at least one outermost mask and a corresponding one of the second set of opposite sides of the support frame.

17. An evaporation apparatus, comprising: an evaporation source; and the mask assembly according to claim 1, wherein the support frame in the mask assembly is closer to the evaporation source than the plurality of masks.

* * * * *